(12) United States Patent
Runge et al.

(10) Patent No.: US 10,134,937 B2
(45) Date of Patent: Nov. 20, 2018

(54) SEMICONDUCTOR PHOTODIODE

(71) Applicant: Fraunhofer-Gesellschaft zur Förderung der angewandten Forschung e.V., Munich (DE)

(72) Inventors: Patrick Runge, Berlin (DE); Tobias Beckerwerth, Berlin (DE); Sten Seifert, Berlin (DE)

(73) Assignee: Fraunhofer-Gesellschaft zur Förderung der angewandten Forschung e.V., München (DE)

( * ) Notice: Subject to any disclaimer, the term of this patent is extended or adjusted under 35 U.S.C. 154(b) by 0 days.

(21) Appl. No.: 15/578,885

(22) PCT Filed: Jun. 3, 2016

(86) PCT No.: PCT/EP2016/062661
§ 371 (c)(1),
(2) Date: Dec. 1, 2017

(87) PCT Pub. No.: WO2016/193436
PCT Pub. Date: Dec. 8, 2016

(65) Prior Publication Data
US 2018/0175231 A1    Jun. 21, 2018

(30) Foreign Application Priority Data

Jun. 4, 2015    (DE) .................. 10 2015 210 343

(51) Int. Cl.
*H01L 31/107* (2006.01)
*H01L 31/0232* (2014.01)
(Continued)

(52) U.S. Cl.
CPC ...... *H01L 31/1075* (2013.01); *G02B 6/12004* (2013.01); *H01L 31/0232* (2013.01);
(Continued)

(58) Field of Classification Search
CPC ............... H01L 31/105; H01L 31/1075; H01L 31/1844; H01L 31/0232; H01L 31/022408; H01L 31/101; G02B 6/12004; G02B 6/10
(Continued)

(56) References Cited

U.S. PATENT DOCUMENTS 4,479,222 A    10/1984   Hawrylo
5,193,131 A *   3/1993   Bruno ............... G02B 6/42
                                                   257/189
(Continued)

FOREIGN PATENT DOCUMENTS

CN    103489953 A    1/2014
EP    0278408 A2    8/1988

OTHER PUBLICATIONS

Campbell, "Recent Advances in Avalanche Photodiodes", 2015, Electrical and Computer Engineering Department, University of Virginia, M3c.1, pp. 1-3.
(Continued)

*Primary Examiner* — Dao H Nguyen
(74) *Attorney, Agent, or Firm* — The Webb Law Firm

(57) ABSTRACT

A semiconductor photodiode, including a light-absorbing layer; an optical waveguide via which light can evanescently be coupled into the light-absorbing layer, and a doped contact layer arranged between the light-absorbing layer and the optical waveguide. The optical waveguide at least sectionally has a doping which produces a diffusion barrier counteracting a diffusion of dopant of the contact layer into the optical waveguide.

18 Claims, 1 Drawing Sheet

(51) Int. Cl.
*H01L 31/18* (2006.01)
*G02B 6/10* (2006.01)
*G02B 6/12* (2006.01)
*H01L 31/101* (2006.01)
*H01L 31/0224* (2006.01)

(52) U.S. Cl.
CPC .... *H01L 31/022408* (2013.01); *H01L 31/101* (2013.01); *H01L 31/1844* (2013.01)

(58) Field of Classification Search
USPC ....... 257/186, 189, 290, 432, 436, 458, 459, 257/461, E31.127, E31.066, E31.076, 257/E31.096; 385/14, 30; 438/32, 48, 87
See application file for complete search history.

(56) References Cited

U.S. PATENT DOCUMENTS

| | | | |
|---|---|---|---|
| 6,437,372 B1 | 8/2002 | Geva et al. | |
| 7,795,640 B2* | 9/2010 | Klipstein | H01L 31/101 257/185 |
| 7,868,406 B2* | 1/2011 | Bach | G02B 6/12004 257/436 |
| 2014/0138789 A1 | 5/2014 | Lim et al. | |
| 2015/0226918 A1* | 8/2015 | Bauters | H01L 31/105 385/14 |

OTHER PUBLICATIONS

Kato et al., "Design of Ultrawide-Band, High-Sensitivity p-i-n Protodetectors" IEICE Trans. Electron, 1993, vol. E76-C:2 pp. 214-221.

Nada et al., "Design and Performance of High-Speed Avalanche Photodiodes for 100-Gb/s Systems and Beyond", Journal of Lightwave Technology, 2015, vol. 33:5, pp. 984-990.

Nada et al. "High-power-tolerant InAlAs avalanche photodiode for 25 Gbit/s applications", Electronics Letters, 2013, vol. 49:1, pp. 62-63.

Nada et al. "High-speed high-power-tolerant avalanche photodiode for 100-Gb/s applications", 2014 IEEE Photonics Conference, NTT Phonics Laboratories, NTT Corporation, Japan, pp. 172-173.

Rungeet al. "Waveguide integrated InP-based photodetector for 100Gbaud applications operating at wavelengths of 1310nm and 1550nm", 2015 European Conference on Optical Communication Fraunhofer Heinrich-Hertz-Institute, Berlin, pp. 1-3.

Shimizu et al., "40 Gbit/s waveguide avalance photodiode with p-type absorption layer and thin InAlAs multiplication layer",Electronics Letters, 2007, vol. 43:8, pp. 476-477.

Takeda et al., "Contributions to Franz-Keldysh and Avalance Effects to Responsivity of a Germanium Waveguide Photodiode in the L-Band." IEEE Journal of Selected Topics in Quantum Electronics, 2014, vol. 20:4, pp. 1-7.

Zhou et al. "Modeling of Multiple-Quantum-Well p-i-n Photodiodes", IEEE Journal of Quantum Electronics, 2014, vol. 50:4, pp. 220-227.

Zhou et al., "PDL optimization in waveguide MQW pin photodiodes", 2013 13th International Conference on Numerical Simulation of Optoelectronic Devices, NUSOD, 2014, pp. 181-182.

\* cited by examiner

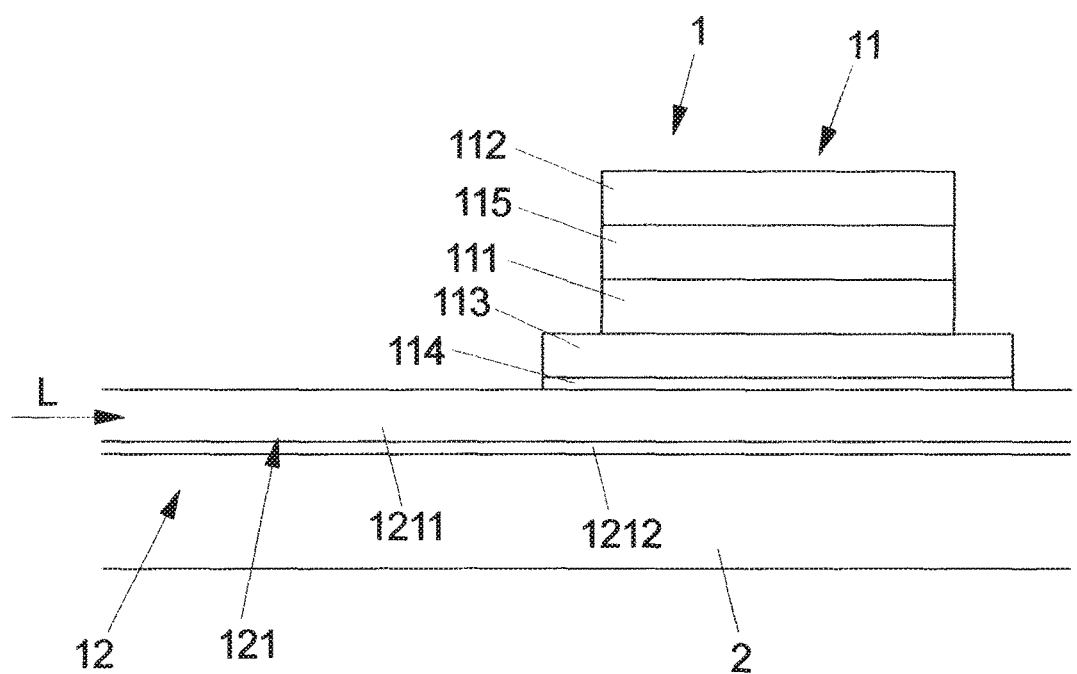

SEMICONDUCTOR PHOTODIODE

CROSS-REFERENCE TO RELATED APPLICATIONS

This application is the United States national phase of International Application No. PCT/EP2016/062661 filed Jun. 3, 2016, and claims priority to German Patent Application No. 10 2015 210 343.9 filed Jun. 4, 2015, the disclosures of which are hereby incorporated in their entirety by reference.

BACKGROUND OF THE INVENTION

Field of the Invention

This invention relates to a semiconductor photodiode and to a method for manufacturing a semiconductor photodiode.

Description of Related Art

From the prior art, semiconductor photodiodes are known which for example are used for the reception of optical data signals. Such semiconductor photodiodes in particular have a p-i-n diode structure into which light is coupled e.g. via an integrated optical waveguide. In addition, avalanche photodiodes are known, which beside an intrinsic layer (absorber layer) include a multiplier layer for amplifying the charge carriers produced in the absorber layer.

Such avalanche photodiode is disclosed for example in the article M. Nada et al., "Design and Performance of High-Speed Avalanche Photodiodes for 100-Gb/s Systems and Beyond", IEEE J. Lightwave Technol. 33, 984 (2015). To avoid coupling in of light via the n-contact and the multiplier layer, the n-contact is arranged above the absorber layer, while the p-contact is located below the absorber layer. Such diode structures however can have the disadvantage that there occurs a diffusion of dopant, in particular of the p-contact layer, out into adjacent layers.

SUMMARY OF THE INVENTION

A problem to be solved by the invention consists in creating a semiconductor photodiode as reliable as possible and yet efficient.

This problem is solved by the semiconductor photodiode with the features as described herein.

Accordingly, there is provided a semiconductor photodiode, comprising
  a light-absorbing layer;
  an optical waveguide via which light can evanescently be coupled into the light-absorbing layer;
  a doped contact layer arranged between the light-absorbing layer and the optical waveguide,
  wherein the optical waveguide at least sectionally has a doping which produces a diffusion barrier counteracting a diffusion of dopant of the contact layer into the optical waveguide (and in particular also a diffusion of dopant of the contact layer out of the contact layer).

The optical waveguide is an integrated waveguide, i.e. it is formed in a manner known per se by at least one semiconductor layer arranged on a substrate. The waveguide also is designed and arranged relative to the light-absorbing layer (the absorber layer) such that light from the waveguide can couple over into the light-absorbing layer by evanescent coupling.

The evanescent coupling in particular is effected via a portion of the waveguide which is located below the light-absorbing layer. Thus, the light coupling over from the waveguide into the light-absorbing layer propagates into the light-absorbing layer in particular at an angle to the waveguide (for example at least approximately vertically) and at least partly exits through the doped contact layer arranged between the light-absorbing layer and the optical waveguide.

The doping of the optical waveguide provides for blocking of a diffusion of the dopant of the contact layer out of the contact layer and into the optical waveguide and thus in particular counteracts a deterioration of the electrical properties of the photodiode. Thus, the highest possible intrinsic sensitivity of the photodiode can be achieved, whereby less gain (electrical amplification) is required, which in turn leads to less noise and hence to a possible higher RF bandwidth of the photodiode.

The doping of the optical waveguide, however, influences its optical properties only to a small extent, so that an efficient evanescent coupling out of the waveguide into the light-absorbing layer is possible despite the doping. For example the invention can provide for the realization of an avalanche photodiode which has a coupling coefficient for the coupling between the waveguide and the light-absorbing layer which is comparable with that of a p-i-n photodiode.

The doping of the waveguide in particular extends at least in a region of the waveguide facing the light-absorbing layer, namely in particular along its longitudinal direction. It is possible that the doping is present along the entire length of the waveguide. It is also conceivable, however, that the doping only extends over a part of the waveguide length; for example, only that region of the waveguide is provided with the doping which is located below the light-absorbing layer.

It also is possible that only the core layer (or the core layers) of the optical waveguide has/have the doping and a shell layer of the waveguide at least substantially remains undoped. However, this is not absolutely necessary. The doping rather can also be present only in a shell layer of the waveguide or both in the core and in the shell layer. It should also be noted that beside the doping for the production of the diffusion barrier the optical waveguide, i.e. its core and/or shell layer(s), can of course also have further dopings.

The doping of the optical waveguide in particular is a doping complementary to the doping of the contact layer. For example, the contact layer is p-doped, so that the optical waveguide correspondingly is provided with an n-doping to produce the diffusion barrier. In principle, however, the reverse case also is conceivable, namely the fact that the contact layer is n-doped and the waveguide is p-doped.

As already indicated above, the optical waveguide can have the doping acting as diffusion barrier in a first region (e.g. of the waveguide core) facing the contact layer and in a second region (e.g. likewise of the waveguide core) can have no doping or a doping different from the doping for the production of the diffusion barrier. For example, the first and the second region are formed from the same material. It is also conceivable, however, that the second region is formed from another material than the first region.

The first region for example comprises the waveguide core and the second region the waveguide shell. For example, at least a part of the waveguide shell is formed by a doped substrate of the photodiode, so that the second region is formed by a portion of the substrate. It is conceivable that the substrate is a semi-insulating substrate and the second region of the waveguide hence likewise is semi-insulating.

It also is possible that between the contact layer and the optical waveguide a blocking layer is disposed, which as an additional diffusion barrier counteracts a diffusion of dopant of the contact layer into the optical waveguide. Analogous to the optical waveguide, the blocking layer in particular has a doping which is complementary to the doping of the contact layer. In particular, the blocking layer has an n-doping.

According to another aspect of the invention a further, complementarily doped contact layer is disposed on a side of the light-absorbing layer facing away from the contact layer. The further contact layer correspondingly is in particular n-doped, when the contact layer arranged between the waveguide and the light-absorbing layer includes a p-doping.

The semiconductor photodiode according to the invention in particular is an avalanche photodiode, wherein in particular a multiplier layer is arranged on a side of the light-absorbing layer facing away from the contact layer and in particular between the light-absorbing layer and the further contact layer.

The optical waveguide in particular is formed in a manner known per se in the form of a rib or strip waveguide. In addition, the optical waveguide, as already mentioned above, can at least partly (for instance its at least one core layer) be arranged on a (in particular semi-insulating) substrate (e.g. be grown onto the substrate) and/or be at least partly (for instance its at least one shell layer) be formed by the (in particular semi-insulating) substrate.

It is conceivable for example that a substrate made of indium phosphide is used, wherein the contact layer and the optical waveguide, at least its waveguide core, are formed from an InGaAsP layer. The invention is of course not limited to particular materials. It is also conceivable for example that a silicon substrate is used.

According to another variant of the invention the index of refraction of the contact layer is greater than the index of refraction of the optical waveguide or the index of refraction of the light-absorbing layer is greater than the index of refraction of the optical waveguide. This in particular serves to realize a coupling between the optical waveguide and the light-absorbing layer as efficient as possible.

The semiconductor photodiode according to the invention can be used e.g. as receiver in optical communications engineering (i.e. as component of a data transmission system) (in particular as receiver for short transmission routes, such as in the burst-mode operation).

The invention also relates to a method for manufacturing a semiconductor photodiode, in particular as described above, comprising the following steps:
  producing a light-absorbing layer;
  producing an optical waveguide such that via the optical waveguide light can evanescently be coupled into the light-absorbing layer;
  producing a doped contact layer between the light-absorbing layer and the optical waveguide; and
  doping of the optical waveguide such that a diffusion barrier is obtained, which counteracts a diffusion of dopant of the contact layer into the optical waveguide.

BRIEF DESCRIPTION OF THE DRAWING

The invention will subsequently be explained in detail by means of an exemplary embodiment with reference to the FIGURE. The FIGURE shows a sectional view through a semiconductor photodiode according to the invention.

DESCRIPTION OF THE INVENTION

Accordingly, the semiconductor photodiode 1 as shown in the FIGURE includes a diode portion 11 as well as an optical waveguide 12, into which light L is coupled and guided to the diode portion 11. The waveguide 12 includes at least one core layer 121 (e.g. an InGaAsP layer) grown onto a substrate 2 (e.g. of semi-insulating InP), wherein a portion of the substrate 2 adjoining the core layer 121 forms a shell layer of the waveguide 12. The invention is of course not limited to a special configuration of the waveguide 12. It is conceivable for example that additional layers are present to form the waveguide core and/or the waveguide shell.

The diode portion 11 of the semiconductor photodiode 1 is arranged on a partial region (in particular an end region) of the waveguide 12, wherein light couples over from the waveguide 12 into the diode portion 11 by evanescent coupling. In particular, light from the waveguide 12 couples into a (in particular intrinsic) light-absorbing layer 111 (e.g. an InGaAs layer) of the diode portion 11.

The light-absorbing layer 111 is a layer of a layer packet which forms an avalanche photodiode and which beside the light-absorbing layer 111 correspondingly comprises a highly doped n-contact layer 112 (e.g. an $n^{++}$-InAlAs layer) and a highly doped p-contact layer 113 (e.g. in the form of a $p^{++}$-InGaAsP layer) arranged between the light-absorbing layer 111 (the absorber) and the optical waveguide 12. Thus, in this configuration the n-contact (formed by the n-contact layer 112) of the photodiode is located at the top, while the p-contact (formed by the p-contact layer 113) is formed as inner layer of the layer packet.

The layer packet of the diode portion 11 in addition includes a multiplier layer 115 (e.g. in the form of an InAlAs layer) arranged between the light-absorbing layer 111 and the n-contact layer 112, which serves to amplify the charge carriers produced in the light absorbing layer 111 upon incidence of light. The mode of operation of an avalanche photodiode however is known per se, so that this will not be discussed further at this point. By arranging the n-contact layer at the top and the p-contact layer at the bottom it is avoided that the light must couple out of the waveguide 12 through the n-contact and the multiplier layer 115 into the light-absorbing layer 111 (which would involve higher optical losses).

The p-contact layer 113 is highly doped, which involves the risk that doping material (e.g. Zn) diffuses out of the p-contact layer 113 into the underlying waveguide 12, which would impair the performance of the photodiode 1. At the same time, a diffusion of a dopant of the waveguide 12, in particular of a dopant (e.g. Fe) of the substrate 2, into the diode portion 11 (in particular into the p-contact layer 113 and possibly also into the light-absorbing layer 111) can occur in the reverse direction. The possibility of a diffusion of dopant out of the p-contact layer 113 and/or the waveguide 12 in particular exists with dopants not compatible with each other, such as Zn and Fe.

For this reason, at least one (upper) sublayer 1211 of the core layer 121 of the optical waveguide 12, which faces the diode portion 11 (and hence the contact layer 113), is provided with a doping which counteracts a diffusion of dopant of the contact layer 113 into the waveguide 12. The doping is a doping complementary to the doping of the p-contact layer 113, i.e. an n-doping. A lower sublayer 1212 of the core layer 121 does not have this n-doping or only in a smaller concentration. It is conceivable, however, that the sublayer 1212 is formed semi-insulating, i.e. has another doping. The upper sublayer 1211 for example is an $n^+$-InGaAsP layer and the lower sublayer 1212 is a semi-insulating InGaAsP layer. For example, the diffusion-blocking upper sublayer 1211 of the waveguide has a thickness in the range of 100 to 200 nm.

The n-doping of the waveguide 12 substantially produces a change in the electrical properties of the waveguide 12, i.e. the above-mentioned blocking effect against a diffusion of dopant out of the p-contact layer 113 and/or out of the waveguide 12, while the optical properties of the waveguide 12, which primarily are specified by the material composition of the waveguide layers, are changed by the doping only to a small extent. In particular, the evanescent coupling of the light into the diode portion 12 is not impaired by the doping of the waveguide 12, or only to a small extent.

Between the p-contact layer 113 and the optical waveguide 12 there is also arranged a blocking layer 114, which analogous to the waveguide 12 has a doping complementary to the doping of the p-contact layer 113 (hence an n-doping), in order to further counteract a diffusion of dopant of the p-contact layer 113 into the optical waveguide 12. In particular, the blocking layer 114 consists of the same material as the upper (diffusion-blocking) sublayer 1211 of the waveguide 12, e.g. of $n^+$-InGaAsP. The blocking layer 114 however only is optional, i.e. as diffusion barrier the doping of the waveguide 12 also might be sufficient. In particular, it is possible that the blocking layer 114 has a smaller thickness than the doped, diffusion-blocking region (i.e. the sublayer 1211) of the waveguide 12.

LIST OF REFERENCE NUMERALS 1 semiconductor photodiode
2 substrate
11 diode portion
12 optical waveguide
111 light-absorbing layer
112 n-contact layer
113 p-contact layer
114 blocking layer
115 multiplier layer
1211 upper sublayer
1212 lower sublayer

The invention claimed is:

1. A semiconductor photodiode, comprising
a light-absorbing layer;
an optical waveguide via which light can evanescently be coupled into the light-absorbing layer; and
a doped contact layer arranged between the light-absorbing layer and the optical waveguide,
wherein the optical waveguide at least sectionally has a doping which produces a diffusion barrier counteracting a diffusion of dopant of the contact layer into the optical waveguide.

2. The semiconductor photodiode according to claim 1, wherein the at least sectionwise doping of the optical waveguide is complementary to the doping of the contact layer.

3. The semiconductor photodiode according to claim 1, wherein the doping of the contact layer is a p-doping.

4. The semiconductor photodiode according to claim 3, wherein the doping of the optical waveguide for producing the diffusion barrier is an n-doping.

5. The semiconductor photodiode according to claim 1, wherein in a first region facing the contact layer the optical waveguide has the doping acting as a diffusion barrier and a further doping in a second region.

6. The semiconductor photodiode according to claim 5, wherein the second region is formed semi-insulating due to the further doping.

7. The semiconductor photodiode according to claim 1, wherein between the contact layer and the optical waveguide a blocking layer is disposed, which as an additional diffusion barrier counteracts a diffusion of dopant of the contact layer into the optical waveguide.

8. The semiconductor photodiode according to claim 7, wherein the blocking layer has a doping complementary to the doping of the contact layer.

9. The semiconductor photodiode according to claim 8, wherein the doping of the blocking layer is an n-doping.

10. The semiconductor photodiode according to claim 1, wherein on a side of the light-absorbing layer facing away from the contact layer a further, complementarily doped contact layer is arranged.

11. The semiconductor photodiode according to claim 10, wherein the further contact layer is n-doped.

12. The semiconductor photodiode according claim 10, wherein the semiconductor photodiode is formed as an avalanche photodiode, wherein a multiplier layer is arranged on a side of the light-absorbing layer facing away from the contact layer and between the light-absorbing layer and the further contact layer.

13. The semiconductor photodiode according to claim 1, wherein the optical waveguide is formed in the form of a rib or strip waveguide.

14. The semiconductor photodiode according to claim 1, wherein the optical waveguide is at least partly arranged on a semi-insulating substrate, and/or is at least partly formed by the semi-insulating substrate.

15. The semiconductor photodiode according to claim 14, wherein the optical waveguide is at least partly grown on the semi-insulating substrate.

16. The semiconductor photodiode according to claim 1, wherein the substrate is made of indium phosphide, wherein the contact layer and the optical waveguide are at least partly formed from an InGaAsP layer.

17. The semiconductor photodiode according to claim 1, wherein the index of refraction of the contact layer is greater than the index of refraction of the optical waveguide and/or the index of refraction of the light-absorbing layer is greater than the index of refraction of the optical waveguide.

18. A method for manufacturing a semiconductor photodiode according to claim 1, the method comprising the following steps:
producing a light-absorbing layer;
producing an optical waveguide such that via the optical waveguide light can evanescently be coupled into the light-absorbing layer;
producing a doped contact layer between the light-absorbing layer and the optical waveguide (12); and
doping of the optical waveguide such that a diffusion barrier is obtained, which counteracts a diffusion of dopant of the contact layer into the optical waveguide.

* * * * *